United States Patent [19]

Namose

[11] Patent Number: 5,520,770
[45] Date of Patent: May 28, 1996

[54] METHOD OF FABRICATING SEMICONDUCTOR DEVICE

[75] Inventor: Isamu Namose, Nagano, Japan

[73] Assignee: Seiko Epson Corporation, Tokyo, Japan

[21] Appl. No.: 765,234

[22] Filed: Sep. 25, 1991

[30] Foreign Application Priority Data

Sep. 28, 1990 [JP] Japan ................................. 2-259451
Sep. 28, 1990 [JP] Japan ................................. 2-259452
Sep. 24, 1991 [JP] Japan ................................. 3-243627

[51] Int. Cl.$^6$ ........................................................ B44C 1/22
[52] U.S. Cl. ........................................ 156/643.1; 437/225
[58] Field of Search ................................. 437/225, 228; 156/643, 646, 656, 643.1, 646.1, 656.1

[56] References Cited

U.S. PATENT DOCUMENTS

| | | | |
|---|---|---|---|
| 4,713,141 | 12/1987 | Tsang | 156/646 |
| 4,726,879 | 2/1988 | Bondur et al. | 156/646 |
| 4,778,563 | 10/1988 | Stone | 156/662 |

FOREIGN PATENT DOCUMENTS

| | | |
|---|---|---|
| 0007549 | 1/1978 | Japan . |
| 62-250642 | 10/1987 | Japan . |
| 63-260133 | 10/1988 | Japan . |
| 63-278339 | 11/1988 | Japan . |
| 63-278338 | 11/1988 | Japan . |
| 63-299343 | 12/1988 | Japan . |
| 63-316440 | 12/1988 | Japan . |

OTHER PUBLICATIONS

Coburn, J, Plasma–Assisted Etching, Plasma Chemistry and Processing, vol. 2, No. 1, 1982, pp. 1–7.
Fior et al, "Dry Etching Process of $SiO_2$ With High Selectivity", *Solid State Technology*, Jun. 1988, pp. 42–46.
Kato et al, "26a–ZF–10; 26a–ZF–11; 26p–ZF–1; 26p–ZF–2; 26p–ZF–3; 26p–ZF–4"; Unknown.
Hess et al, "Etching of Tungsten . . . Halogen", *Solid State Technology*, Jun. 1988, pp. 27–36.
Hayasak et al, "High Selective . . . Reactor", *Solid State Technology*, Jun. 1988, pp. 37–41.

*Primary Examiner*—R. Bruce Breneman
*Attorney, Agent, or Firm*—Sughrue, Mion, Zinn, Macpeak & Seas; Richard C. Turner; Raymond H. J. Powell, Jr.

[57] ABSTRACT

A method for fabricating a semiconductor device comprises the steps of introducing a reaction gas into a reaction chamber maintained at a predetermined pressure and applying at least one of a radio frequency and a microwave to activate the reaction gas to thereby process a material to be etched. According to one aspect of the invention, $Cl_2$ is used as a main etching gas and either and inert gas or a gas having the formula $C_nF_{(2n+2)}$ is used as an additive gas. The method produces an anisotropically etched profile and, advantageously has a high selectivity for different types of materials. Postprocessing for removing oxide films can also be dispensed with.

18 Claims, 4 Drawing Sheets

METHOD OF FABRICATING SEMICONDUCTOR DEVICE

BACKGROUND OF THE INVENTION

1. Field of the Invention

The present invention relates generally to a method of fabricating a semiconductor device, and, more specifically, to a dry etching method for fabricating a semiconductor device.

2. Prior Art

Conventional methods of fabricating semiconductor devices implement anisotropic etching, as disclosed in Japanese Unexamined Patent Publication Nos. 316440/1988, 299343/1988, 278339/1988, 278338/1988, and 260133/1988, which disclose a variety of etching gas species, by protecting the sidewalls of a material to be etched. As shown in FIGS. 7, for example, a wafer which is to be subjected to etching includes a silicon substrate 21, a silicon oxide film 25, a polycrystalline silicon (polysilicon) layer 22 and a photoresist layer 24, in that order. In order to protect the sidewalls, a deposit 26 is formed on the sidewalls.

While some recent methods implement etching with extremely satisfactory profile control by adding $Cl_2$ to HBr, they protect the sidewalls by deposition of an oxide film in a manner similar to that of the said Japanese Unexamined Patent Publication No. 316440/1988.

Thus, in the methods of fabricating semiconductor devices disclosed above, anisotropic etching is implemented by protecting the sidewalls of a material to be etched with a silicon oxide film-containing deposit, which requires additional processing of the semiconductor device for removing the deposited film after the etching process has been completed, thereby complicating the fabrication process. At the same time, deposit-induced contamination can also cause problems in the functioning of semiconductor elements. In addition, since the profile-controlled etching, which involves addition of $Cl_2$ to HBr, deposits oxide films to protect the sidewalls, in a manner similar to the said Japanese Unexamined Patent Publication No. 316440/1988, such etching requires postprocessing for removing the oxide film in order to further process a gate material. For this reason, the gate oxide film below the ends of the gate is consequently removed simultaneously, which, it will be noted, decrease of the breakdown voltage of the gate film.

SUMMARY OF THE INVENTION

The invention was motivated by a desire to overcome these problems. Accordingly, an object of the invention is to provide a method of anisotropic etching which does not include the formation of a deposit on the sidewalls of a material to be etched.

To achieve the above object, the invention is applied to a method of fabricating a semiconductor device comprising the steps of introducing a reaction gas into a vacuum and applying energy at a radio or microwave frequency to activate the reaction and thereby process a material to be etched. According to one aspect of the invention, $Cl_2$ is used as a main etching gas and one of an inert gas or $C_nF_{(2n+2)}$ is used as an additive gas.

While helium, argon, or xenon can advantageously be used as the inert gas in the invention, the inert gas is preferably helium. The additive gas satisfying the formula $C_nF_{(2n+2)}$ can advantageously be $CF_4$, $C_2F_6$, or $C_3F_8$, with $CF_4$ being the particularly preferred additive gas.

According to another aspect of the present invention, a polycide, polysilicon, single-crystal silicon, a silicon nitride film, or the like, can be used as the material to be etched.

The addition of an inert gas to $Cl_2$, which serves as a main etching gas, determines the rate of reaction on the sidewalls of the material to be etched and brings about a state in which the physical energy of the reactive species exceeds the reaction rate determined by the inert gas in the vertical direction, thereby allowing an anisotropically etched profile to be obtained. Since fluorine is not present in the etching gas, a high selectivity can be ensured relative to materials of different kinds such as oxide films.

The addition of $C_nF_{(2n+2)}$ to $Cl_2$, which serves as a main etching gas, $C_nF_{(2n+2)}$ forms $CF_x$-containing polymers on the sidewalls of the material being etched, thereby allowing an anisotropically etched profile to be obtained. Since the deposited film is not a silicon oxide containing film, no postprocessing for removing the oxide film is required, thereby preventing deterioration of the gate film breakdown strength caused by the otherwise resultant simultaneous removal of a gate oxide film below the ends of a gate.

These and other objects, features and advantages of the invention are disclosed in or apparent from the following description of preferred embodiments.

BRIEF DESCRIPTION OF THE DRAWINGS

The preferred embodiments are described with reference to the drawings, in which like elements are denoted throughout by like or similar numbers, and in which.

DETAILED DESCRIPTION OF THE PREFERRED EMBODIMENTS

Figure 1:
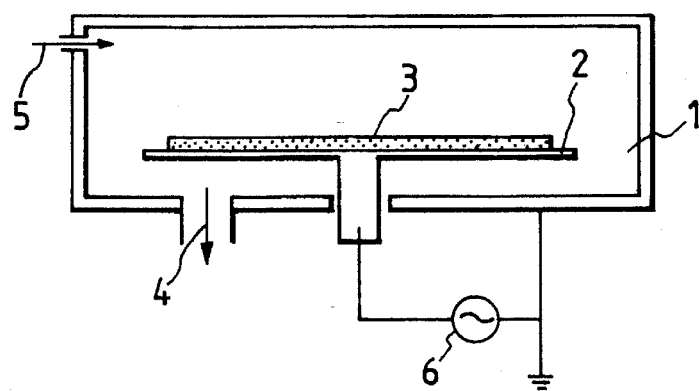
FIGS. 1 to 3 are illustrative diagrams showing the structures of etching devices suitable for implementing the inventive steps of the present invention.
Figure 2:
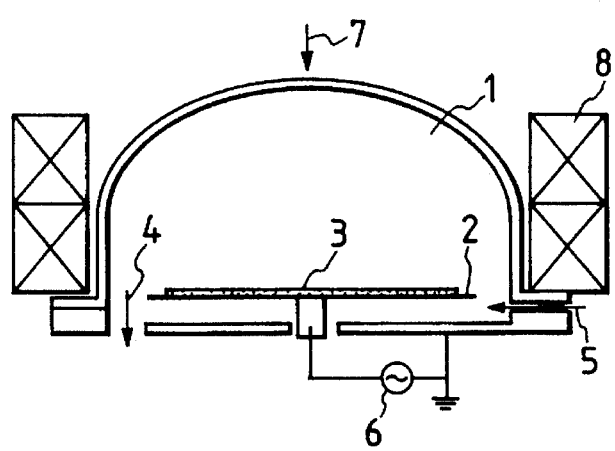
Figure 3:
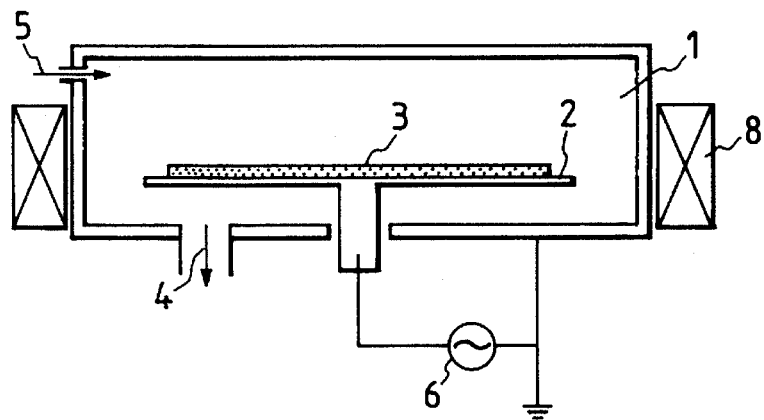

Before describing the preferred embodiments of the present invention, which are discussed with respect to FIGS. 4–6, devices for implementing the etching steps of the inventive methods will first be discussed. Referring first to FIGS. 1 through 3, a reaction chamber 1 surrounding an electrode 2, which supports a wafer 3 on which a semiconductor device is to be formed, includes an exhaust gas outlet 4 and a gas inlet 5. A radio frequency power supply 6 is connected to both chamber 1 and electrode 2. As shown in FIG. 2, a microwave power supply 7 can advantageously be located so as to irradiate wafer 3. In addition, one or more magnetic field coils 8, shown in FIGS. 2 and 3, can be disposed to surround reaction chamber 1. It will be apparent that at least one of a magnetic field and electromagnetic energy, in either the radio or microwave frequency range, can be applied to reaction chamber 1.

It will also be noted that the device shown in FIG. 1 has a structure suitable for an etching process generally referred to as reactive ion etching (RIE), the device shown in FIG. 2 is adapted to perform an etching process generally referred to as electron cyclotron resonance etching (ECR), while the device illustrated in FIG. 3 is suitable for an etching process typically referred to as magnetron enhanced reactive ion etching (MERIE).

The preferred embodiments of the present invention will now be discussed while referring to FIGS. 4(a) to 4(d), which Figures show sectional views of the etched profiles of the semiconductor devices produced by the present invention. In FIGS. 4(a) to (d), a substrate 21, upon which a silicon oxide film 25 is deposited, comprises various layers including a high melting point metal 20, a polycrystalline silicon (polysilicon) 22, a silicon nitride film 23 and a photoresist 24. The arrangement of these layers will be discussed in greater detail below. The high melting point metal advantageously can be a polycide and preferably is a tungsten polycide.

First to third embodiments of the present invention, in which an inert gas is used as an additive gas, will now be described.

According to a first embodiment of the present invention, a wafer 3 comprising a silicon substrate 21, a silicon oxide film 25, a polysilicon layer 22 and a photoresist layer 24, in that order, is subjected to etching in the etching device shown in FIG. 1. Preferably, the etching process is conducted under the following conditions: chlorine ($Cl_2$) as a reaction gas and helium (He) as an inert gas are supplied at flow rates of 100 standard cubic centimeters per minute (sccm) and 50 sccm, respectively, while the pressure in reaction chamber 1 is maintained at 180 milli Torrs (mTorr) and electromagnetic energy at a radio frequency (hereafter radio frequency power) of 250 watts (at 13.56 MHz) is applied to a 6 inch wafer 3 via electrode 2 and reaction chamber 1.

Figure 4A:
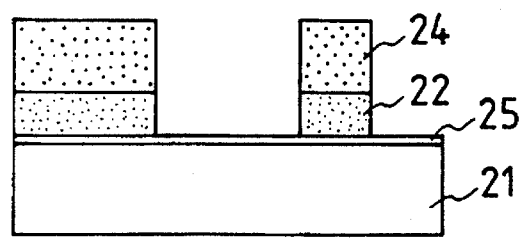
FIGS. 4(a) to 4(d) are sectional views showing the resultant structure produced by the preferred embodiments of the present invention.

The results of the etching process conducted according to the parameters discussed above are shown in Table 1. For example, an etch rate of 378 nanometers per minute (nm/min) with a intrawafer uniformity of 3.2% was achieved. Examination of wafer 3 after etching revealed that there were no deposits on the wafer 3 or side etching of the etched sidewalls of the polysilicon layer 22. The resultant structure is shown in FIG. 4(a).

TABLE 1

| Gas | $Cl_2$ | 100 sccm |
|---|---|---|
| | He | 50 sccm |
| Pressure | | 180 mTorr |
| RF power | | 250 watts |
| Etch rate | | 378 nm/min |
| Uniformity | | 3.2% |

Figure 4B:
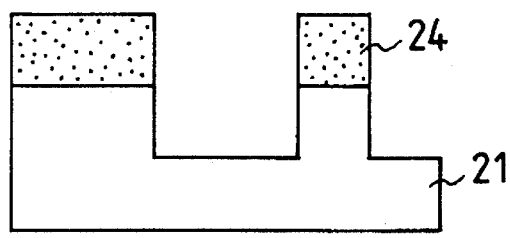

A second embodiment will now be described while referring to FIGS. 2 and 4(b). A wafer 3 comprising a single crystal silicon substrate 21 covered with a photoresist layer 24 is etched using the device illustrated in FIG. 2. Preferably, the following conditions are used: chlorine ($Cl_2$) as the reaction gas and helium (He) as an inert-gas are supplied at flow rates of 120 sccm and 40 sccm, respectively, while reaction chamber 1 pressure is maintained at 10 mTorr and a radio frequency power of 150 watts (at 13.56 MHz) is applied at electrode 2 and reaction chamber 1 and electromagnetic energy at microwave frequencies (hereafter microwave power) of 200 watts (at 2.45 GHz) is radiated at 6 inch wafer 3. The etching results are listed in Table 2 and the resultant structure is shown in FIG. 4(b). According to the second embodiment of the present invention, an etch rate of 425 nm/min and the intrawafer uniformity of 2.7% can be achieved. No deposition or side etching of the sidewalls were observed.

TABLE 2

| Gas $Cl_2$ | 120 sccm |
|---|---|
| He | 40 sccm |
| Pressure | 10 mTorr |
| RF power | 150 watts |
| Microwave power | 200 watts |
| Etch rate | 425 nm/min |
| Uniformity | 2.7% |

Figure 4C:
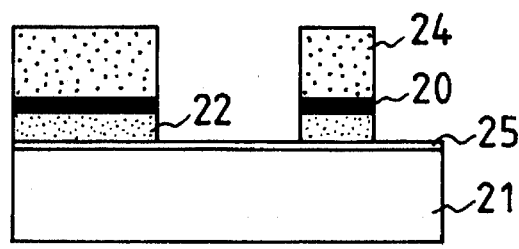

A third embodiment will now be described while referring to FIGS. 3 and 4(c). Wafer 3, comprising a silicon substrate 21, silicon oxide film 25, polysilicon 22, metal layer 20, which preferably is tungsten polycide, and photoresist layer 24 is subjected to an etching process under the following conditions: chlorine ($Cl_2$) as a reaction gas and helium (He) as an inert gas are supplied at flow rates of 150 sccm and 70 sccm, respectively while reaction chamber pressure is maintained at 100 mTorr and a radio frequency power of 250 watts (at 13.56 MHz) and a magnetic field of 125 gauss are applied to a 6-inch wafer 3. The etching results are listed in Table 3 and shown in FIG. 4(c). An etch rate for polysilicon layer 22 of 375 nm/min and an intrawafer uniformity of 3.1% and an etch rate for the tungsten polycide layer 20 of 246 nm/min and an intrawafer uniformity of 4.2% are shown in Table 3. There was no observed deposition or side etching on the etched sidewalls of the tungsten polycide, as shown in FIG. 4(c).

TABLE 3

| Gas $Cl_2$ | 150 sccm |
|---|---|
| He | 70 sccm |
| Pressure | 100 mTorr |
| RF power | 250 watts |
| Magnetic field | 125 gauss |
| Etch rate of polycide | 375 nm/min |
| Uniformity of polycide | 3.1% |
| Etch rate of $WSi_2$ | 246 nm/min |
| Uniformity of $WSi_2$ | 4.2% |

Figure 4D:
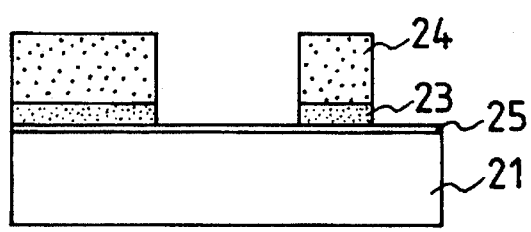
Figure 7:
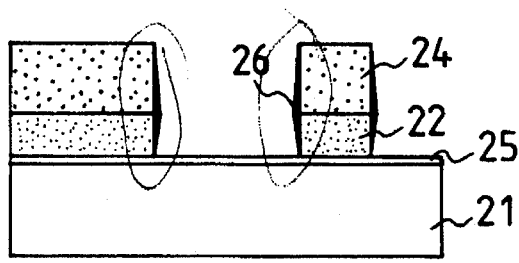
FIG. 7 is a sectional view used in illustrating a conventional etching process.

In addition, a wafer 3, comprising a silicon substrate 21, a silicon oxide film 25, a silicon nitride film 23 and a photoresist layer 24, advantageously can be etched under conditions similar to those described above for etching the polysilicon layer 22. An etch rate of 165 nm/min and an intrawafer uniformity of 3.0% advantageously can be produced. There was no observed deposition or side etching on the etched sidewalls of silicon nitride film 23, as shown in FIG. 4(d).

It will be appreciated from description immediately above, that the present invention advantageously permits various types of silicon-containing materials to be etched using a plurality of etching devices including those particularly illustrated in FIGS. 1–3.

The inert gas used in the preferred embodiments discussed immediately above advantageously can be one of helium, argon and xenon, although helium is preferably used as the inert gas.

Figure 5A:
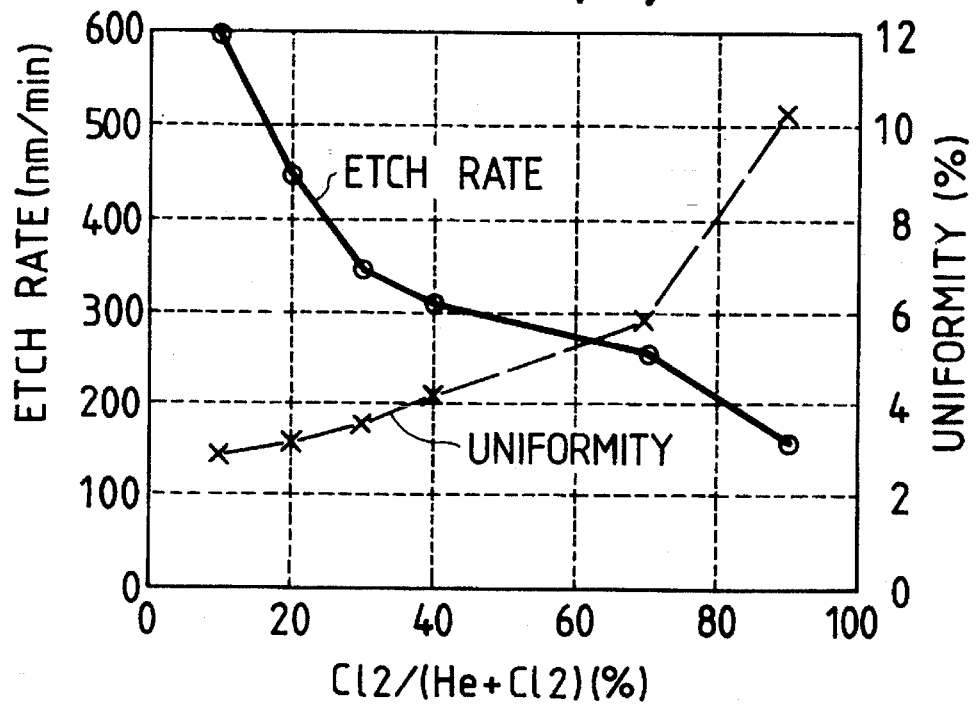
FIGS. 5(a) and 5(b) and FIGS. 6(a) and 6(b) are graphs showing etching characteristics according to the present invention as a function of the chlorine concentration in an etching gas.
Figure 5B:
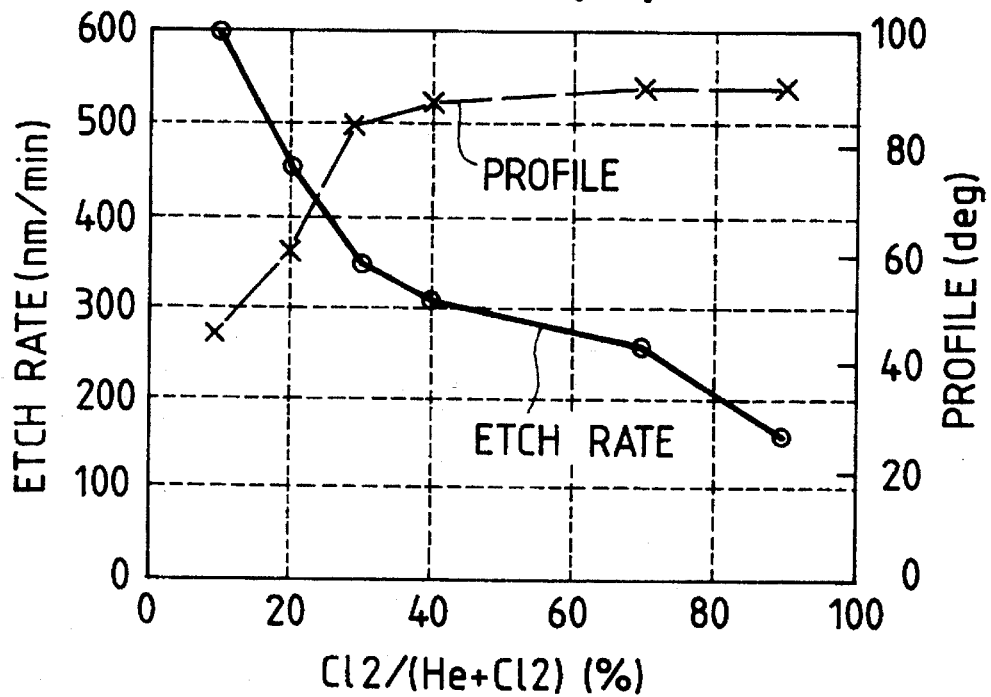

FIGS. 5(a) and 5(b) show the etching characteristics as a function of chlorine concentration in an etching gas. In particular, the etching characteristics are shown for an etching gas comprising $Cl_2$ and He, with the etching gas being maintained at 180 mTorr during the application of radio frequency power of 250 watts. It will be appreciated from these Figures that concentrations of $Cl_2/(He+Cl_2) \times 100 > 40\%$ are preferable for obtaining satisfactory profile control.

Fourth to sixth embodiments of the present invention, in which $C_nF_{(2n+2)}$ is used as the additive gas instead of He, will now be described in detail.

The fourth embodiment will be described while referring to FIGS. 1 and 4(a). In this embodiment, polysilicon layer 22 is subjected to an etching process using the REI device shown in FIG. 1 under the following conditions: chlorine ($Cl_2$) as a reaction gas and $CF_4$ as an additive gas are supplied to reaction chamber 1 at flow rates of 100 sccm and 40 sccm, respectively, while the pressure in reaction chamber 1 is maintained at 180 mTorr and while a radio frequency power of 250 watts (at 13.56 MHz) is applied to a 6-inch wafer 3 via electrode 2. The etch rate according to this embodiment of the invention was 324 nm/min while the intrawafer uniformity was 3.5%, as shown in Table 4. Again, there was no observed deposition of a silicon oxide film or side etching on the etched sidewalls of the polysilicon layer 22, shown in FIG. 4(a).

TABLE 4

| Gas $Cl_2$ | 100 sccm |
|---|---|
| $CF_4$ | 40 sccm |
| Pressure | 180 mTorr |
| RF power | 250 watts |
| Etch rate | 324 nm/min |
| Uniformity | 3.5% |

According to a fifth embodiment of the present invention, a single-crystal silicon can advantageously be etched using the ECR etching device illustrated in FIG. 2, under the following conditions: chlorine ($Cl_2$) as a reaction gas and $CF_4$ as an additive gas are supplied at flow rates of 120 sccm and 60 sccm, respectively, while the pressure in reaction chamber 1 is maintained at 10 mTorr and while a radio frequency power of 150 watts (at 13.56 MHz) and a microwave power of 200 watts (at 2.45 GHz) were applied to a 6-inch wafer 3. The resulting etch rate and intrawafer uniformity, i.e., 406 nm/min and 2.9%, respectively, were achieved, as shown in Table 5. There was no observed deposition of a silicon oxide film or side etching on the etched sidewalls of the single crystal silicon layer 21 structure shown in FIG. 4(b).

TABLE 5

| Gas $Cl_2$ | 120 sccm |
|---|---|
| $CF_4$ | 60 sccm |
| Pressure | 10 mTorr |
| RF power | 150 watts |
| Microwave power | 200 watts |
| Etch rate | 406 nm/min |
| Uniformity | 2.9% |

According to a sixth embodiment of the present invention, a tungsten polycide can advantageously be etched using the etching device illustrated in FIG. 3, which is suitable for MERIE, under the following conditions: chlorine ($Cl_2$) as a reaction gas and $CF_4$ as an additive gas are supplied at flow rates of 150 sccm and 80 sccm, respectively, while the pressure in reaction chamber 1 is maintained at 100 mTorr and a radio frequency power of 250 watts (at 13.56 MHz) and a magnetic field of 125 gauss are applied to a 6-inch wafer 3. The resultant etch rate and intrawafer uniformity, 224 nm/min. and 4.1%, respectively, are shown in Table 6. There again was no observed deposition of a silicon oxide film or side etching on the etched sidewalls of the tungsten polycide layer 20, as shown in FIG. 4(c).

TABLE 6

| Gas $Cl_2$ | 150 sccm |
|---|---|
| $CF_4$ | 80 sccm |
| Pressure | 100 mTorr |
| RF power | 250 watts |
| Magnetic field | 125 gauss |
| Etch rate of polycide | 356 nm/min |
| Uniformity of polycide | 3.2% |
| Etch rate of $WSi_2$ | 224 nm/min |
| Uniformity of $WSi_2$ | 4.1% |

It will be noted that a silicon nitride film 23 advantageously can be etched under conditions similar to those described for etching polysilicon layer 22. A resultant etch rate of 156 nm/min and an intrawafer uniformity of 3.1% advantageously can be achieved. As shown in FIG. 4(d), there is no observable deposition of a silicon oxide film or side etching on the etched sidewalls of the silicon nitride film 23.

It will understood from the foregoing description that the invention allows various types of silicon-containing materials to be etched with etching devices of various types, including the devices specifically illustrated in FIGS. 1–3.

It will also be noted that, while the fourth through sixth embodiments were discussed with respect to the use of $CF_4$ gas as the additive gas, the present invention is not limited to etching gas mixtures employing only this compound.. Other suitable additive gases having the formula $C_nF_{(2n+2)}$, such as $C_2F_6$ and $C_3F_8$, advantageously can be used. Preferably, $CF_4$ is used as the additive gas, since it produces the best results.

Figure 6A:
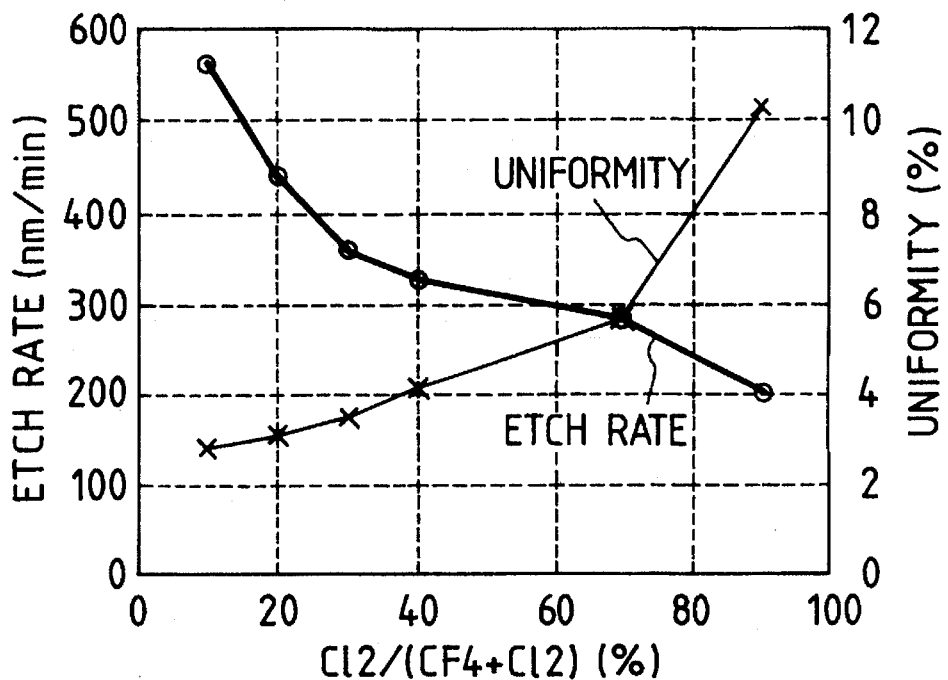
Figure 6B:
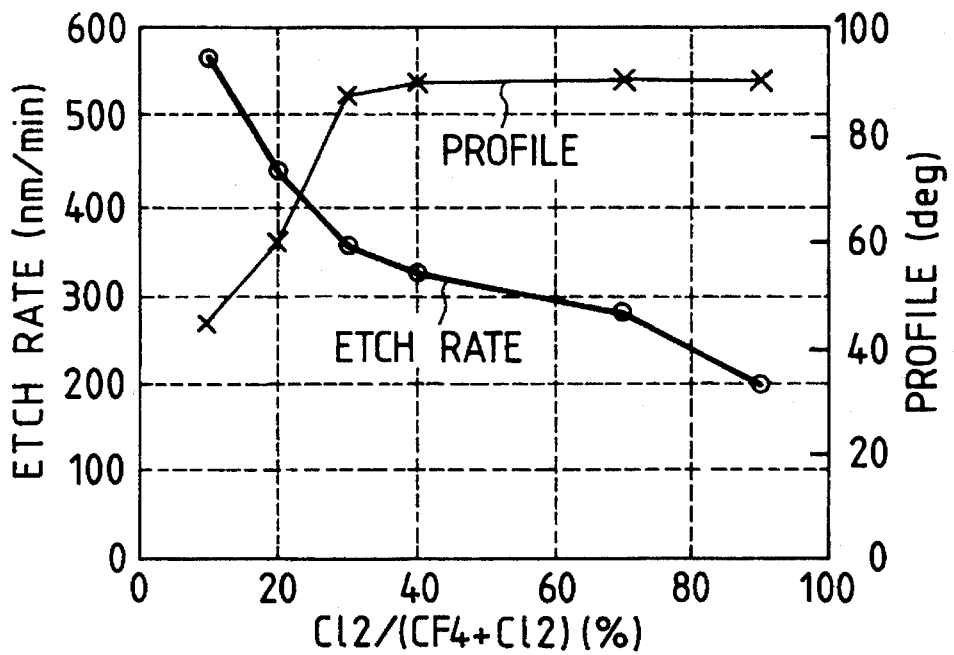

FIGS. 6(a) and 6(b) illustrate the etching characteristics as a function of the chlorine concentration in the etching gas. More specifically, these graphs illustrate etching characteristics when $CF_4$ is added to $Cl_2$ gas to produce an etching gas, which is maintained at 180 mTorr during the application of a radio frequency power of 250 watts. As is apparent from the graphs in FIGS. 6(a) and 6(b), concentrations of $Cl_2/(CF_4+Cl_2) \times 100 > 40\%$ are preferable for obtaining satisfactory profile control.

As described above, the present invention involves addition of an inert gas to $Cl_2$, which is the main etching gas, where such addition determines the rate of reaction on the sidewalls of the material to be etched and brings about a state in which the physical energy of the reactive species exceeds the reaction rate determined by the inert gas in the vertical direction, thereby allowing an anisotropically etched profile to be obtained. Since there is no deposit on the sidewalls of the etched material, the postprocessing for removing the deposited film can dispensed with, which simplifies the etching process. At the same time, there is little possibility that deposit-induced contamination will cause problems with the functioning of semiconductor elements. In addition, an etching gas containing no fluorine allows a high selectivity to be obtained relative to different kinds of materials such as oxide films.

The addition of $C_nF_{(2n+2)}$ to $Cl_2$, which is the main etching gas, allows the formation of $CF_x$-containing polymers on the sidewalls of the material to be etched, thereby allowing an anisotropically etched profile to be obtained. Since the deposited film is not a silicon oxide-containing film but made of polymers, it is removable together with a resist film in a resist film removal process. Accordingly, no postprocessing for removing the oxide film is required, which, it will be noted, prevents deterioration of the gate film breakdown strength normally associated with the otherwise simultaneous removal of a gate oxide film below the ends of the gate.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of fabricating a semiconductor device comprising the steps of introducing a reaction gas comprising a main etching gas and an additive gas into a vacuum and applying at least one of a radio frequency or microwave to activate said reaction gas and thereby process a material to be etched, wherein chlorine in used as said main etching gas and an inert gas is used as said additive gas and wherein said material includes silicon.

2. The method of fabricating a semiconductor device according to claim 1, wherein said inert gas is helium.

3. The method of fabricating a semiconductor device according to claim 1, wherein said inert gas is argon.

4. The method of fabricating a semiconductor device according to claim 1, wherein said inert gas is xenon.

5. The method of fabricating a semiconductor device according to claim 1, wherein said material to be etched is polycide.

6. The method of fabricating a semiconductor device according to claim 1, wherein said material to be etched is polycrystalline silicon.

7. The method of fabricating a semiconductor device according to claim 1, wherein said material to be etched is single crystal silicon.

8. The method of fabricating a semiconductor device according to claim 1, wherein said material to be etched is a silicon nitride film.

9. A method of fabricating a semiconductor device comprising the steps of introducing a reaction gas comprising a main etching gas and an additive gas into a reaction chamber and applying at least one of a radio frequency or microwave to activate said reaction gas and thereby process a material to be etched, wherein chlorine is used as said main etching gas and $C_nF_{(2n+2)}$ gas is used as said additive gas, wherein a ratio of main etching gas to additive gas is expressed by $(Cl_2)/(Cl_2+\text{additive gas})\times 100$, wherein said ratio is greater than about 40 percent, wherein said $C_nF_{(2n+2)}$ gas permits formation of removable CFx-containing polymers on sidewalls of said material to be etched so as to permit production of an anisotropically etched profile, and wherein said material includes silicon.

10. The method of fabricating a semiconductor device according to claim 9, wherein said $C_nF_{(2n+2)}$ gas is $CF_4$.

11. The method of fabricating a semiconductor device according to claim 9, wherein said $C_nF_{(2n+2)}$ gas is $C_2F_6$.

12. The method of fabricating a semiconductor device according to claim 9, wherein said $C_nF_{(2n+2)}$ gas is $C_3F_8$.

13. The method of fabricating a semiconductor device according to claim 9, wherein said material to be etched is a polycide.

14. The method of fabricating a semiconductor device according to claim 9, wherein said material to be etched in polycrystalline silicon.

15. The method of fabricating a semiconductor device according to claim 9, wherein said material to be etched is single crystal silicon.

16. The method of fabricating a semiconductor device according to claim 9, wherein material to be etched is a silicon nitride film.

17. A method of fabricating a semiconductor device, said method comprising the steps of:

supplying a reaction gas in a reaction chamber which is maintained at a predetermined pressure, wherein said reaction gas comprises a mixture of $Cl_2$ and an additive gas; and applying electromagnetic energy at a predetermined frequency so as to activate said reaction gas and thereby process a material to be etched;

wherein a ratio of main etching gas to additive gas is expressed by $(Cl_2)/(Cl_2+\text{additive gas})\times 100$;

wherein said additive gas is $C_nF_{(2n+2)}$ gas;

wherein said $C_nF_{(2n+2)}$ gas permits formation of removable CFx-containing polymers on sidewalls of said material to be etched so as to permit production of an anisotropically etched profile; and wherein said material includes silicon.

18. A method of fabricating a semiconductor device, said method comprising the steps of:

supplying a reaction gas in a reaction chamber which is maintained at a predetermined pressure, wherein said reaction gas comprises a mixture of $Cl_2$ and an additive gas; and applying electromagnetic energy at a predetermined frequency so as to activate said reaction gas and thereby process a material to be etched;

wherein a ratio of main etching gas to additive gas is expressed by $(Cl_2)/(Cl_2+\text{additive gas})\times 100$;

wherein said additive gas is an inert gas;

wherein said ratio is greater than about 40 percent; and wherein said material includes silicon.

* * * * *